(12) United States Patent  (10) Patent No.: US 6,653,192 B1
Ryoo  (45) Date of Patent: Nov. 25, 2003

(54) METHOD OF MANUFACTURING SEMICONDUCTOR DEVICES USING NITRIFICATION

(75) Inventor: Doo Yeol Ryoo, Chungjoo-Shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/310,866

(22) Filed: Dec. 6, 2002

(30) Foreign Application Priority Data

Oct. 14, 2002  (KR) ........................................ 2002-62420

(51) Int. Cl.$^7$ .......................................... H01L 21/8234
(52) U.S. Cl. ........................ 438/275; 438/528; 438/981
(58) Field of Search ................................. 438/275, 407, 438/528, 776, 792, 981

(56) References Cited

U.S. PATENT DOCUMENTS

| | | | | |
|---|---|---|---|---|
| 5,960,289 | A | * 9/1999 | Tsui et al. | 438/275 |
| 6,165,849 | A | * 12/2000 | An et al. | 438/275 |
| 6,225,167 | B1 | * 5/2001 | Yu et al. | 438/275 |
| 6,268,266 | B1 | * 7/2001 | Hwang et al. | 438/440 |

OTHER PUBLICATIONS

Seok–Woo Lee, et al.; Gate Oxide Thinning Effects at the Edge of Shallow Trench Isolation in the Dual Gate Oxide Process; 1999 IEEE; pp. 249–252.

Kenneth K. O., et al.; Integration of Two Different Gate Oxide Thicknesses in a 0.6–μm Dual Voltage Mixed Signal CMOS Process; IEEE Transactions on Electron Devices; vol. 42, No. 1; Jan. 1995; pp. 190–192.

* cited by examiner

*Primary Examiner*—Chandra Chaudhari
(74) *Attorney, Agent, or Firm*—Jacobson Holman PLLC

(57) ABSTRACT

The present invention relates to a method of manufacturing a semiconductor device by which a high voltage device and a low voltage device are simultaneously formed. Nitrogen ions are implanted only into the semiconductor substrate in the low voltage device region. An oxidation process under $N_2O$ gas or NO gas ambient is then performed to form a first nitrification oxide film having a thick thickness in a high voltage device region and a second nitrification oxide film having a thin thickness and a high concentration of nitrogen ions in a low voltage device region. Next, the first and second nitrification oxide films are rapidly nitrified to form a dual gate insulating film consisting of third and fourth nitrification oxide films having a high dielectric constant. Therefore, reliability of a gate insulating film can be improved and increase in the leakage current can be also prevented.

16 Claims, 3 Drawing Sheets

1

METHOD OF MANUFACTURING SEMICONDUCTOR DEVICES USING NITRIFICATION

BACKGROUND OF THE INVENTION

1. Field of the Invention

The invention relates generally to a method of manufacturing a semiconductor device. More particularly, the invention relates to a method of manufacturing a semiconductor device by which a high voltage device and a low voltage device are simultaneously formed in such a manner that nitrification oxide films having different thickness is formed by a single oxidation process and is then nitrified to form a dual gate insulating film having an increased dielectric constant.

2. Description of the Prior Art

Two or more devices having different driving voltages are formed in a single substrate for low-power consumption and high-performance semiconductor device. In order to manufacture this semiconductor device, a dual gate oxide film in which the thickness of the gate oxide films is different depending on the devices is formed. At the same time, the thickness of the dual gate oxide film is reduced in order to implement high performance, etc. In other words, the gate oxide film of the high voltagelidevice operating at a high voltage is formed to be thicker than the gate oxide film of the low voltage device operating at a low voltage. This is for the purpose of improving the breakdown voltage characteristic against the high voltage.

The conventional method of manufacturing the semiconductor device by which the high voltage device and the low voltage device are simultaneously manufactured will be described by reference to FIG. 1A through FIG. 1C.

Referring now to FIG. 1A, a device isolation film 102 is formed at a given region of a semiconductor substrate 101, thus defining an active region and an inactive region and simultaneously defining a high voltage device region 'A' and a low voltage device region 'B'. An impurity ion implantation process for forming a well and controlling the threshold voltage is performed. A first oxide film 103 is then formed on the entire structure using hydrogen and oxygen gas. After forming a photoresist film 104 on the first oxide film 103, the photoresist film 104 is patterned to expose the low voltage device region 'B'. Then, the first oxide film 103 in the low voltage device region 'B' is removed using fluoric acid solution by the use of the patterned photoresist film 104 as a mask, to that the semiconductor substrate 101 is exposed.

By reference to FIG. 1B, after the photoresist film 104 is removed, a second oxide film 105 having a thickness thinner than the first oxide film 103 is grown. Thereby, a dual gate oxide film consisting of the first and second oxide films 103 and 105 having different thickness is formed. A polysilicon film 106 is then formed on the entire structure including the dual gate oxide film. Thereafter, given regions of the polysilicon film 106 and the first oxide film 103 in the high voltage device region 'A' and the polysilicon film 106 and the second oxide film 105 in the low voltage device region 'B' are selectively etched by means of a lithography process using the gate mask and an etch process, thus first and second gate electrodes. A low-concentration impurity region 107 is then formed at a given region of the semiconductor substrate 101 by means of a low-concentration impurity ion implantation process using the first and second gate electrodes as a mask.

Referring to FIG. 1C, an oxide film 108 and a nitride film 109 are formed on the entire structure. A dual spacer is then formed at the sidewalls of the first and second gate electrodes by means of a blanket etch process. Next, a high-concentration impurity ion implantation process using the first and second gate electrodes and the spacer formed at the sidewall as a mask is performed. A rapid thermal annealing (RTA) process is then performed to form a high-concentration impurity region 110 at a given region of the semiconductor substrate 101, so that a junction region is formed. Thereafter, a metal film, for example, a cobalt (Co) film is formed; on the entire structure and is then experienced by an annealing process. Due to this, the polysilicon film 106 of the metal film and the first and second gate electrodes and the semiconductor substrate 101 of the junction region react to form a salicide film 111. At this time, the salicide film 111 serves to lower the contact resistance during a wiring process. Thereafter, an insulating film is formed on the entire structure and is then flattened. A contact hole through which the gate electrode and the junction region are exposed is then formed. A conductive layer to bury the contact hole is formed and is then patterned to form a line.

As described above, the conventional method of manufacturing the semiconductor device consisting of the high voltage device and the low voltage device has the following problems.

First, the photoresist film formed on the first oxide film in the high voltage device region, made of an organic material, is not completely removed by a removal process after the first oxide film in the low voltage device region is removed. As the photoresist film may remain on the first oxide film, there is a significant problem that it may lower reliability of the gate oxide film. Also, the device isolation film is etched in the process for etching the first oxide film in the low voltage device region, there is a problem that the leakage current between the devices is increased.

Second, twice thermal oxidation processes are formed in order to grow the first and second oxide films. There is a problem that excess heat is applied to the substrate due to the twice thermal oxidation processes.

Third, the cleaning process is performed before the second oxide film is grown. This makes rough the surface roughness of the first oxide film. Thus, there is a problem that reliability of the oxide film is lowered.

Fourth, the leakage current in the gate oxide film, is greatly increased in the conventional technology wherein a thermal oxide film is used as the thickness of the oxide film is made thin. There is a physical limit in reducing the thickness of the thermal oxide film.

Fifth, when boron ions are implanted into the polysilicon film in order to manufacture a P type semiconductor device, the boron ions are penetrated into a channel region in the annealing process. Due to this, the doping concentration of the channel region is changed to vary the threshold voltage, etc. Also, in case of an N type semiconductor device, electrons and holes moving from source to drain have energy higher than the energy barrier at the interface of the semiconductor substrate and the gate oxide film due to an electric field. There is a problem that the threshold voltage, etc. is reduced since the electrons and holes are introduced into the gate oxide film.

SUMMARY OF THE INVENTION

The present invention is contrived to solve the above problems and an object of the present invention is to provide a method of manufacturing semiconductor device by which nitrogen ions are implanted into a given region and a dual gate insulating film is then formed by a single oxidation process.

Another object of the present invention is to provide a method of manufacturing a semiconductor device by which the dual gate insulating film formed by the single oxidation process is nitrified to increase a dielectric constant.

In the present invention, nitrogen ions having a characteristic which reduces the growth rate of an oxide film is selectively: implanted into a low voltage device region. A nitrification oxide film having a thin thickness and a nitrification oxide film having a thick thickness are then simultaneously formed by means of an oxidation process under $N_2O$ or NO ambient. The nitrification oxide film and the nitrification oxide film are then nitrified by means of a remote plasma nitrification method and are then used as a gate insulating film. Further, a dielectric constant of the nitrification oxide film is increased. A leakage current through the gate insulating film is also reduced as the thickness of an electrical gate insulating film can be reduced by increasing the physical thickness. In addition, the nitrification oxide film has a high resistance to penetration of impurities or hot carriers. Thus, penetration of boron ions of a P type device into the gate insulating film and the channel region can be prevented and the hot carrier characteristic can be improved.

In order to accomplish the above object, the method of manufacturing the semiconductor device according to the present invention, is characterized in that it comprises the steps of defining a semiconductor substrate into a high voltage device region and a low voltage device region and then forming a screen oxide film on the entire structure, performing a nitrogen ion implantation process only for the semiconductor substrate in the low voltage device region and then performing a rapid thermal annealing process, removing the screen oxide film and then performing an oxidation process under a gas ambient containing nitrogen and oxygen to form first and second nitrification oxide films having different thickness on the semiconductor substrate of the high voltage device region and the semiconductor substrate of the low voltage device region, respectively, rapidly nitrifying the first and second nitrification oxide films to form a dual gate insulating film consisting of third and fourth nitrification oxide films, forming a polysilicon film on the dual gate insulating film, etching given regions of the polysilicon film and the third nitrification oxide film in the high voltage device region and the polysilicon film and the fourth nitrification oxide film in the low voltage device region to form first and second gate electrodes, and forming a junction region at a given region of the semiconductor substrate.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1A:
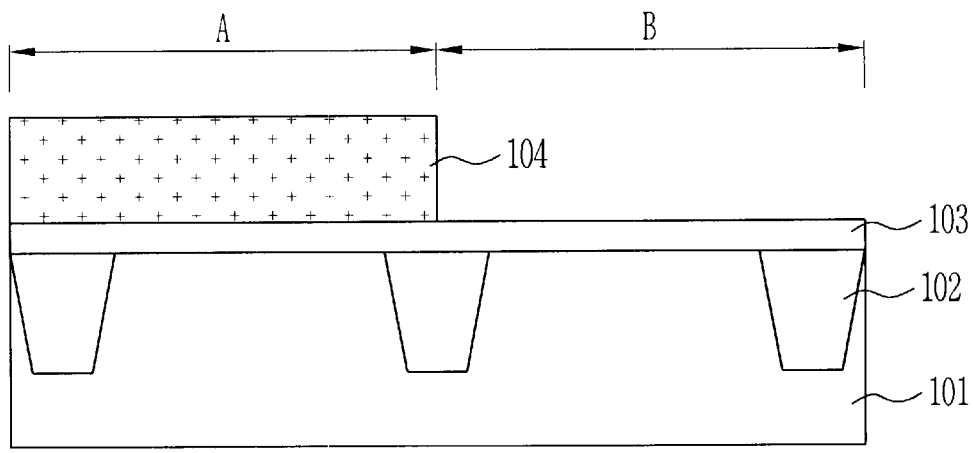
FIG. 1A through FIG. 1C are cross sectional views of semiconductor devices for explaining a conventional method of manufacturing the semiconductor device by which a high voltage device and a low voltage device are simultaneously formed.
Figure 1B:
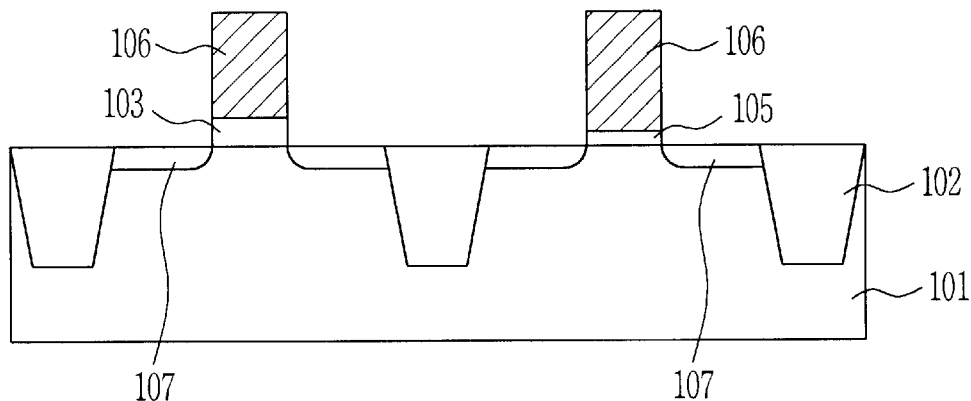
Figure 1C:
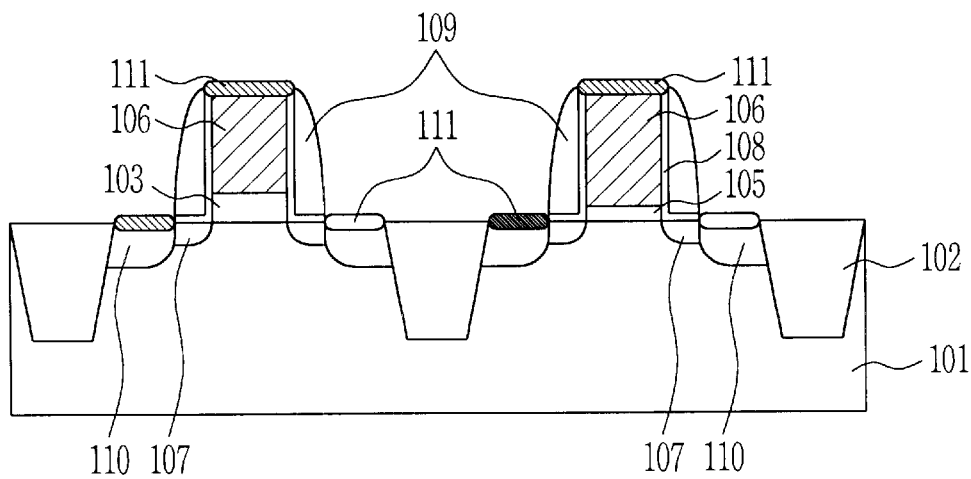

The present invention will be described in detail by way of a preferred embodiment with reference to accompanying drawings, in which like reference numerals are used to identify the same or similar parts.

FIG. 2A through FIG. 2E are cross sectional views of semiconductor devices for explaining a method of manufacturing the semiconductor device by which a high voltage device and a low voltage device are simultaneously formed according to a preferred embodiment of the present invention.

Figure 2A:
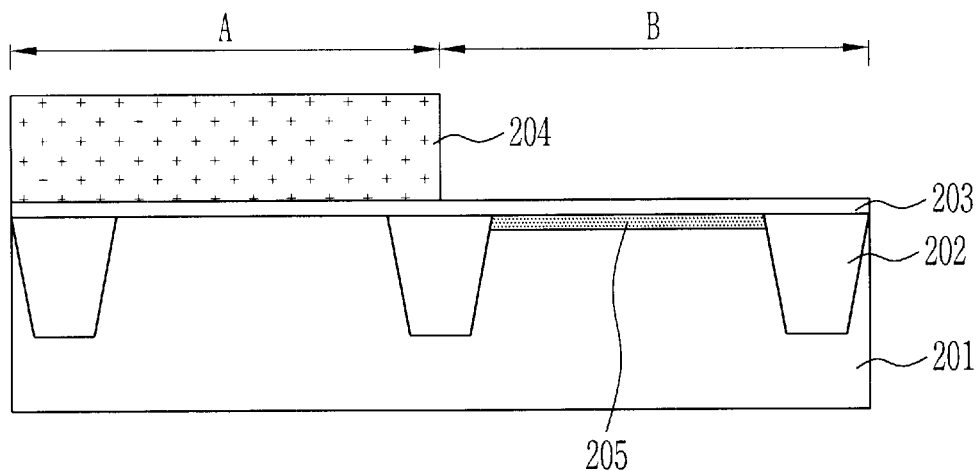
FIG. 2A through FIG. 2E are cross sectional views of semiconductor devices for explaining a method of manufacturing the semiconductor device by which a high voltage device and a low voltage device are simultaneously formed according to a preferred embodiment of the present invention.

Referring now to FIG. 2A, a device isolation film 202 is formed at a given region of a semiconductor substrate 201, thus defining an active region and an inactive region and simultaneously defining a high voltage device region 'A' and a low voltage device region 'B'. An impurity ion implantation process for forming a well and controlling the threshold voltage is performed. A screen oxide film 203 having a thickness of about 45 through 55 Å is then formed on the entire structure. After forming a photoresist film 204 on the entire structure, the photoresist film 204 is patterned to expose the low voltage device region 'B' by means of a lithography process. After nitrogen ions are implanted by the use of the patterned photoresist film 204 as a mask, a rapid thermal annealing process is performed to form a nitrogen ion implanted region 205 on the semiconductor substrate 201 in the low voltage device region 'B' At this time, the nitrogen ion implantation process performed at the energy of 5 through 30 keV and dose of 7E13 through 7E15 ions/cm$^2$. Also, the rapid thermal annealing process is performed under nitrogen ambient at a temperature of 1000 through 1050° C. for 10 through 30 seconds.

Figure 2B:
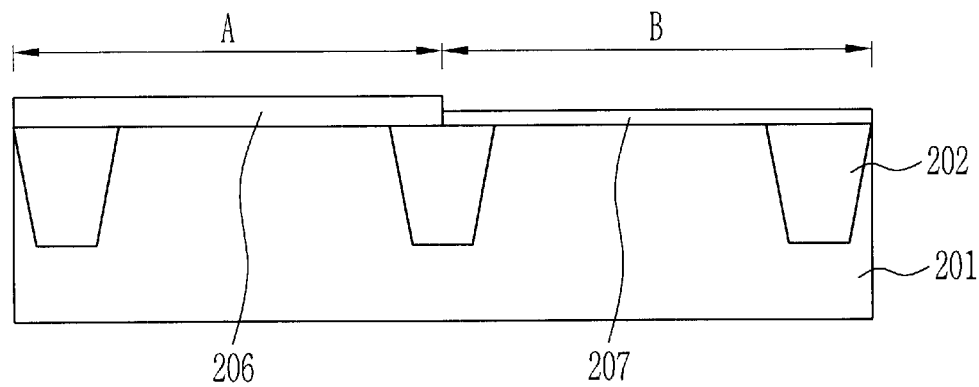

By reference FIG. 2B, the photoresist film 204 and the screen oxide film 203 are removed and a cleaning process is then performed. Next, an oxidation process is performed under a gas ambient including nitrogen and oxygen, for example, $N_2O$ gas or NO. At this time, the oxidation process under the NO ambient is performed by introducing the NO gas of about 300 through 900 sccm at a temperature of 750 through 950 ° C. Also, the oxidation process may be performed by further introducing $N_2$ gas of 5 through 10 slm for process stabilization. Further, the oxidation process under the $N_2O$ ambient is performed by introducing the $N_2O$ gas of about 300 through 900 sccm at a temperature of 800 through: 1050° C. Also, the oxidation process may be performed by further introducing $N_2$ gas of 5 through 10 slm for process stabilization. Thereby, a first nitrification oxide film 206 having a thick thickness is formed on the semiconductor substrate 201 in the high voltage device region 'A'. Also, a second nitrification oxide film 207, which has a thin thickness and a high nitrogen ion concentration since the growth rate of the oxide film is delayed by nitrogen of the nitrogen ion implanted region 205, is formed on the semiconductor substrate 201 in the low voltage device region 'B'. At this time, the first and second nitrification oxide films 206 and 207 maintains a property of the common oxide film since nitrogen ions are accumulated at the boundary of the first and second nitrification oxide films 206 and 207 and the semiconductor substrate 201.

Figure 2C:
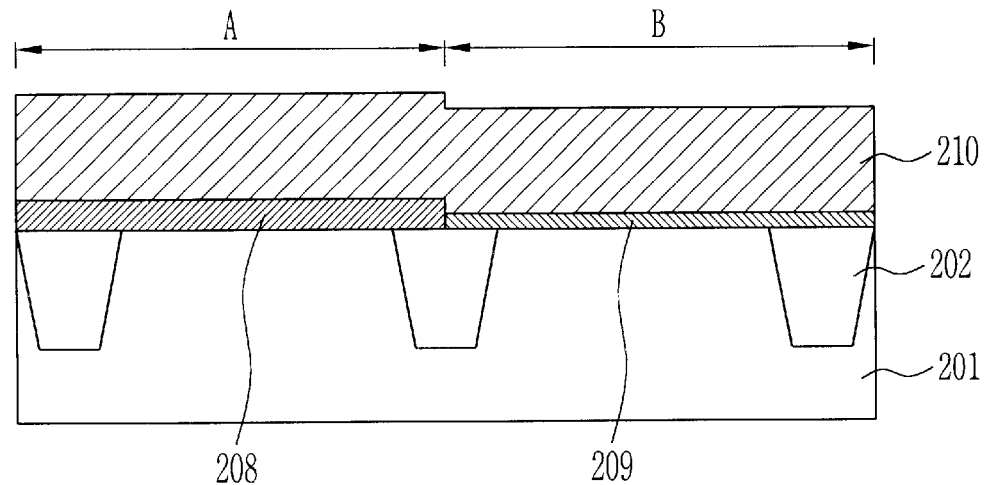

Referring now to FIG. 2C, the surface of the first and second nitrification oxide films 206 and 207 is rapidly nitrified by means of a remote plasma nitrification method. The remote plasma nitrification process is performed under $N_2$ or $NH_3$ at a temperature of 500 through 900 ° C. and a pressure of 1 through 3 Torr for 3 through 5 minutes with application of 100 through 700 W. Thereby, the first and second nitrific ation oxide films 206 and 207 are completely nitrified to form a dual gate insulating film consisting of the third and fourth nitrification oxide films 208 and 209 having a dielectric constant of 4.5 through 6.5. Next, a polysilicon film 210 is formed on the entire structure.

Figure 2D:
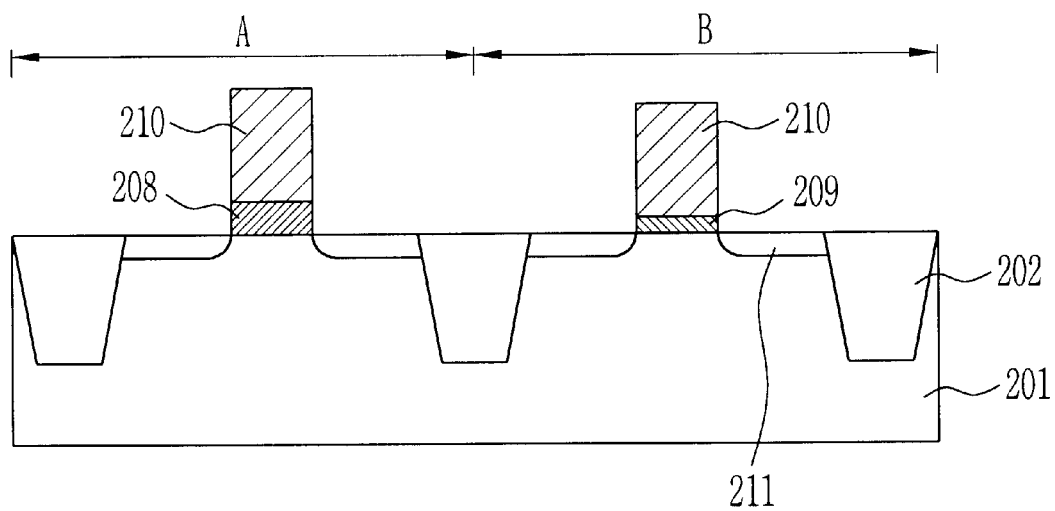

By reference to FIG. 2D, given regions of the polysilicon film 210 and the third nitrification oxide film 208 in the high voltage device region 'A' and the polysilicon film 210 and the fourth nitrification oxide film 209 in the low voltage device region 'B' are selectively etched by means of a lithography process using the gate mask and an etch process, thus forming first and second gate electrodes. At this time, the etch process is performed in an anisotropic dry etch process using an etch gas containing HBr. In order to remove damage generated in the etch process, an annealing process is performed under an oxygen ambient. Next, a low-concentration impurity region 211 is formed at a given region of the semiconductor substrate 201 by means of a low concentration impurity ion implantation process using the first and second gate electrodes as a mask.

Figure 2E:
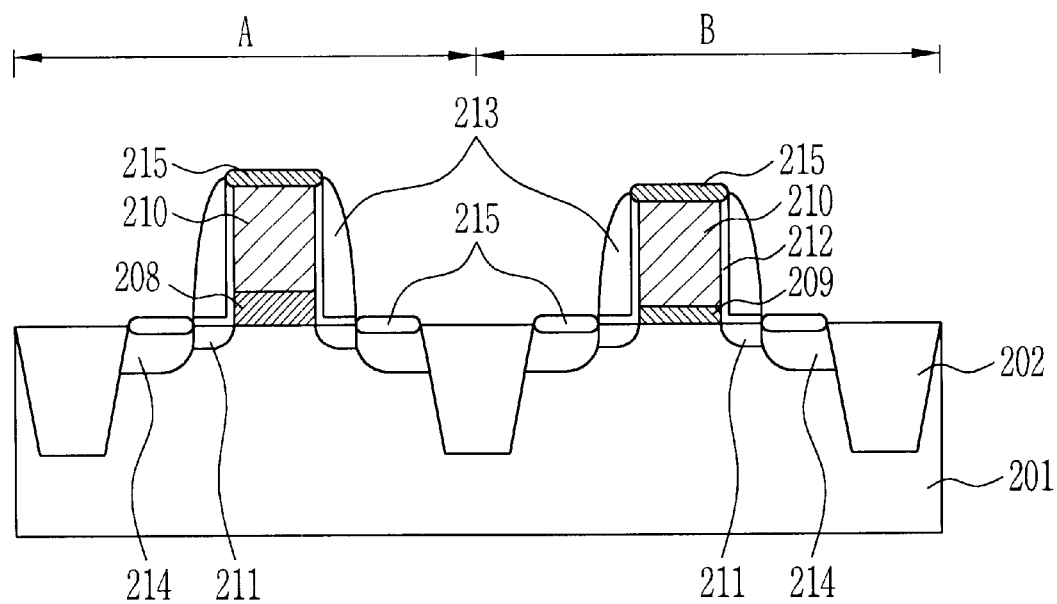

Referring to FIG. 2E, an oxide film 212 and a nitride film 213 are formed on the entire structure. A blanket etch process is then performed to form a dual spacer at the sidewall of the first and second gate electrodes. Next, a high-concentration impurity ion implantation process is performed using the first and second gate electrodes and the spacer formed at their sidewalls as a mask. A rapid thermal annealing process is then performed to a high-concentration impurity region 214 at a given region of the semiconductor substrate 201, thus forming a junction region. Thereafter, a metal film, for example a cobalt (Co) film is formed on the entire structure. An annealing process is then performed to react the polysilicon film 210 in the metal film and the first and second gate electrodes and the semiconductor substrate 201 on the junction region, thus forming a salicide film 215. At this time, the salicide film 215 is formed to lower the contact resistance in a wiring process. An insulating film is formed on the entire structure and is then flattened to form a contact hole through which the gate electrode and the junction region are exposed. Then, a conductive layer is formed so that the contact hole is buried and is then patterned to form a wiring.

As mentioned above, according to the present invention, after nitrogen ions are implanted into the low voltage device region, the nitrification oxide films having different thickness are formed by a single oxidation process. Therefore, the present invention has an advantageous effect that it can improve reliability of the gate insulating film since the photoresist film does not remain on the nitrification oxide film. Further, the present invention has an outstanding effect that it can prevent increase in the leakage current by the device isolation film damaged by an over etch since an etch process among the process of forming the dual gate insulating film is not performed. Also, the annealing process is performed once. Thus, the number of the annealing process is reduced compared to those in the conventional one.

Further, the cleaning process in the process of forming the dual gate insulating film is not performed. Thus, the present invention has an advantageous effect that it can improve a reliability problem of the oxide film generating due to rough surface of the gate insulating film. As the dielectric constant is increased by about 4 through 6.5 using the nitrification oxide film as the gate insulating film, the thickness of the gate insulating film can be reduced by over 1.5 times compared to the prior art. Therefore, the present invention has an advantageous effect that it can reduce the leakage current through the gate insulating film.

In addition, as a hot carrier characteristic in case of an N type semiconductor device is increased using the nitrification oxide film as the gate insulating film, changes in the threshold voltage is prevented. Therefore, the present invention has an advantageous effect that it can improve reliability of the device. In case of a P type semiconductor device, penetration of boron ions injected into the gate electrode into the channel region is prevented. Thus, the present invention has an advantageous effect that it can prevent reduction, etc. in the threshold voltage due to penetrated boron.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing the semiconductor device, comprising the steps of:

defining a semiconductor substrate into a high voltage device region and a low voltage device region and then forming a screen oxide film on the entire structure;

performing a nitrogen ion implantation process only for the semiconductor substrate in the low voltage device region and then performing a rapid thermal annealing process;

removing the screen oxide film and then performing an oxidation process under a gas ambient containing nitrogen and oxygen to form first and second nitrification oxide films having different thickness on the semiconductor substrate of the high voltage device region and the semiconductor substrate of the low voltage device region, respectively;

rapidly nitrifying the first and second nitrification oxide films to form a dual gate insulating film consisting of third and fourth nitrification oxide films;

forming a polysilicon film on the dual gate insulating film;

etching given regions of the polysilicon film and the third nitrification oxide film in the high voltage device region and the polysilicon film and the fourth nitrification oxide film in the low voltage device region to form first and second gate electrodes; and forming a junction region at a given region of the semiconductor substrate.

2. The method as claimed in claim 1, wherein the screen oxide film is formed in thickness of 45 through 55 Å.

3. The method as claimed in claim 1, wherein the nitrogen ion implantation process is performed at the energy of 5 through 30 keV and dose of 7 E13 through 7 E15 ions/cm$^2$.

4. The method as claimed in claim 1, wherein the rapid thermal annealing process is performed under a nitrogen ambient at a temperature of 1000 through 1050° C. for 10 through 30 seconds.

5. The method as claimed in claim 1, wherein the gas containing nitrogen and oxygen is $N_2O$ gas or NO gas.

6. The method as claimed in claim 5, wherein the oxidation process under the NO ambient is performed by introducing the NO gas of about 300 through 900 sccm at a temperature of 750 through 950° C.

7. The method as claimed in claim 6, wherein the oxidation process under the NO gas ambient is performed by further introducing $N_2$ gas of about 5 through 10 slm.

8. The method as claimed in claim 5, wherein the oxidation process under the $N_2O$ ambient is performed by introducing $N_2O$ gas of about 300 through 900 sccm at a temperature of 800 through 1050° C.

9. The method as claimed in claim 8, wherein the oxidation process under the $N_2O$ gas ambient is performed by further introducing $N_2$ gas of about 5 through 10 slm.

10. The method as claimed in claim 1, wherein the first nitrification oxide film is formed to be thicker than the second nitrification oxide film.

11. The method as claimed in claim 1, wherein rapid nitrification is performed in a remote plasma nitrification process.

12. The method as claimed in claim 11, wherein the remote plasma nitrification process is performed under $N_2$ or $NH_3$ ambient at a temperature of 500 through 900° C. and pressure of 1 through 3 Torr for 3 through 5 minutes with application of 100 through 700 W.

13. The method as claimed in claim 1, wherein the third and fourth nitrification oxide films have a dielectric constant of 4.5 through 6.5.

14. The method as claimed in claim 1, wherein the etch process for forming the first and second gate electrodes is an anisotropic dry etch process using an etch gas containing HBr.

15. The method as claimed in claim 1, further comprising the step of after the first and second gate electrodes are formed, performing an annealing process under an oxygen ambient in order to remove damage generated in the etch process.

16. The method as claimed in claim 1, further comprising the steps of after the junction region is formed, forming a salicide film on the first and second gate electrodes and the junction region.

* * * * *